United States Patent [19]

Belohoubeck et al.

[11] 3,825,805

[45] July 23, 1974

[54] TRANSISTOR CARRIER FOR MICROWAVE STRIPLINE CIRCUIT

[75] Inventors: Erwin Franz Belohoubeck, Kendall Park; David Michael Stevenson, Hightstown, both of N.J.

[73] Assignee: RCA Corporation, New York, N.Y.

[22] Filed: May 24, 1973

[21] Appl. No.: 363,629

Related U.S. Application Data

[63] Continuation of Ser. No. 156,814, June 25, 1971, abandoned.

[52] U.S. Cl....... 317/234 R, 317/234 A, 317/234 G, 333/84 M; 317/234 N

[51] Int. Cl. ........................ H01l 3/00, H01l 5/00

[58] Field of Search........ 317/234 A, 234 G, 234 H, 317/234 N, 235 A, 235 B, 101; 333/84 M

[56] References Cited

UNITED STATES PATENTS

| | | | |
|---|---|---|---|
| 3,577,181 | 5/1971 | Belohoubek | 333/84 M |
| 3,671,793 | 6/1972 | Scarlett | 317/235 R |
| 3,713,006 | 1/1973 | Litty | 317/234 A |
| 3,728,589 | 4/1973 | Caulton | 317/234 R |

*Primary Examiner*—Andrew J. James
*Attorney, Agent, or Firm*—Glenn H. Bruestle; Donald S. Cohen; William H. Murray

[57] ABSTRACT

A transistor carrier adapted to be mounted in a microwave transmission line including a metal substrate which is adapted to be connected to the ground plane of the transmission line and a pair of impedance transmission line segments mounted in spaced relation on the substrate. A transistor having base emitter and collector contacts is mounted on one of the transmission line segments with the collector electrode being electrically connected to the transmission line. One of the base or emitter electrodes is electrically connected to the substrate and the other is electrically connected to the other transmission line segment. A series capacitor-impedance element compensating network is mounted on the same transmission line segment as the transistor and is electrically connected between the transmission line and the electrode of the transistor which is connected to the substrate.

8 Claims, 3 Drawing Figures

INVENTORS
ERWIN F. BELOHOUBEK &
DAVID STEVENSON
BY [signature]
ATTORNEY

TRANSISTOR CARRIER FOR MICROWAVE STRIPLINE CIRCUIT

This is a continuation, of application Ser. No. 156,814, filed June 25, 1971, and now abandoned.

BACKGROUND OF THE INVENTION

The invention herein disclosed was made in the course of or under a contract or subcontract thereunder with the Department of the Air Force.

The present invention relates to a transistor carrier for use in a microwave stripline circuit, and more particularly to a carrier which includes a compensating network for the transistor.

Various types of transistor packages or carriers have been used for mounting high power transistors in a microwave stripline circuit. A major problem in all such transistor packages or carriers is the parasitic effect of the body leads between the transistors and the rf circuit. For such power transistors, the critical bonding lead connection is the one going to ground since the inductance of this lead has a regenerative effect and can cause instability. In U.S. Pat. No. 3,577,181 of E. F. Belohoubek, issued May 4, 1971, entitled "Transistor Package for Microwave Stripline Circuits" there is shown and described a transistor package in which the lengths of the bonding leads are greatly reduced in order to reduce the parasitic effects of the bonding leads. However, even with these transistor packages, mechanical considerations set a limit as to how short the bonding leads can be made. For maximum power output of the transistor in a microwave circuit, the base to collector capacitance of the transistor must be cancelled. Previously it has been the practice to incorporate an inductance reactance network at the end of a short output transmission line to achieve this compensation. However, such compensating method has the drawback that it does not help to increase the bandwidth of the transistor or compensate for feedback voltage developed across the grounded lead.

SUMMARY OF THE INVENTION

A transistor carrier which is adapted to be mounted in a microwave stripline circuit includes a metal substrate and a pair of low impedance transmission line segments mounted in spaced relation on the substrate. Each of the transmission line segments includes a metal layer and a dielectric member spacing the metal layer from the substrate. A transistor is mounted on one of the transmission line segments. The transistor has three electrodes, one of which is electrically connected to the metal layer on the one transmission line segment, a second of which is electrically connected to the substrate and the third is electrically connected to the metal layer on the other transmission line segment. A compensating network is mounted on the one transmission line segment and is electrically connected between the second said electrode of the transistor and the metal layer of the one transmission line segment.

DETAILED DESCRIPTION

Figure 1:
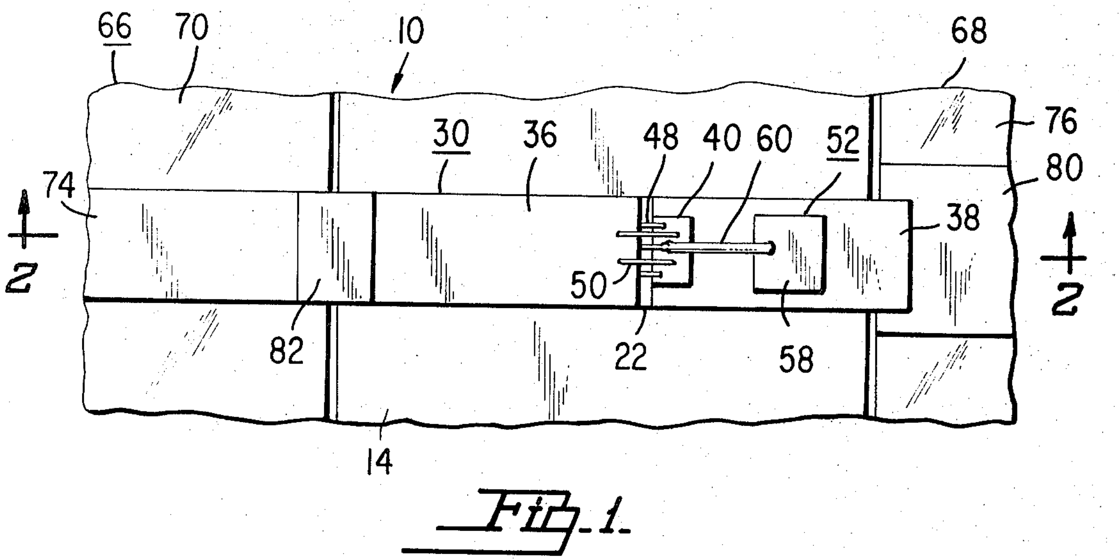
FIG. 1 is a top plan view of a form of the transistor carrier of the present invention in a microwave stripline circuit.
Figure 2:
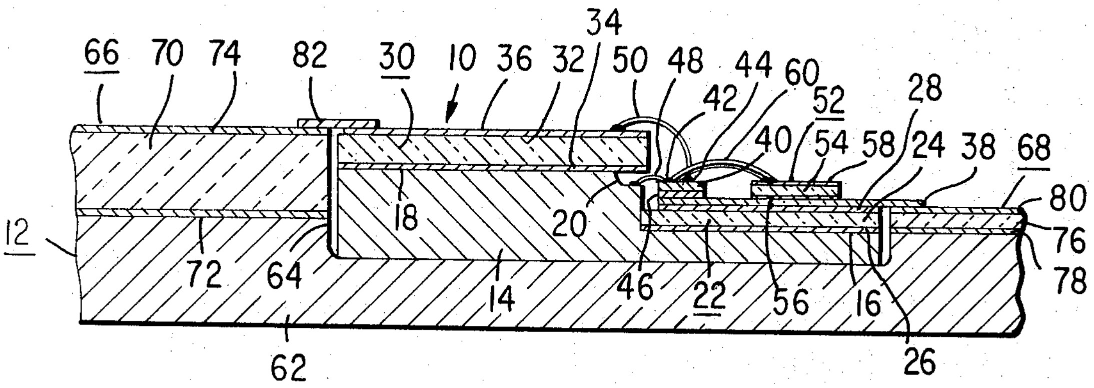
FIG. 2 is a sectional view taken along line 2—2 of FIG. 1.

Referring to FIGS. 1 and 2 of the drawing, there is shown a high power transistor carrier, generally designated as 10, mounted on a strip line circuit, generally designated as 12. The transistor carrier 10 comprises a substrate 14 of an electrically conductive metal, such as molybdenum or a tungsten-copper composite. The top surface of the substrate 14 is stepped to provide a lowermost surface portion 16 at one end of the substrate, an uppermost surface portion 18 at the other end of the substrate and a short intermediate surface portion 20 between the lowermost and uppermost surface portions 16 and 18.

A first low impedance transmission line segment 22 is mounted on the lowermost surface portion 16 of the substrate 14. The first transmission line segment 22 comprises a flat plate 24 of a material having good dielectric and heat conducting properties, such as beryllium oxide or aluminum oxide, and metal layers 26 and 28 coated on the opposed flat surfaces of the plate 24. The metal layers 26 and 28, may be, a molybdenum-manganese mixture or a copper layer over a chromium layer. The first transmission line segment 22 is mounted on the substrate 14 with the metal layer 26 contacting and mechanically bonded such as by brazing, to the lowermost surface portion 16.

A second low impedance transmission line segment 30 is mounted on the uppermost surface portion 18 of the substrate 14. The second transmission line segment 30 comprises a flat plate 32 of a material having good dielectric and heat conducting properties and metal layers 34 and 36 coated on the opposed flat surfaces of the plate. The second transmission line segment 30 is mounted on the substrate 14 with the metal layer 34 contacting and mechanically bonded to the uppermost surface portion 18 of the substrate. As shown in FIG. 2, the second transmission line segment 30 is of a length that it overhangs the intermediate surface portion 20 and extends up to the lowermost surface portion 16 of the substrate.

A strip 38 of an electrically and thermally conductive metal, such as silver, extends over and is bonded to the metal layer 28 of the first transmission line segment 22. The metal strip 38 is of a length so as to extend beyond the end of the substrate 14. A transistor 40 is mounted on the metal strip 38 adjacent the end of the second transmission line segment 30. The transistor 40 has base and emitter electrodes 42 and 44 respectively on the top surface thereof and a metal film 46 on the bottom surface thereof which serves as a collector electrode. The collector electrode 46 is soldered to the metal strip 38 so as to be mechanically and electrically connected thereto. The base electrode 42 is connected to the intermediate surface portion 20 of the substrate 14 by wires 48. The emitter electrode 44 is connected to the metal layer 36 of the second transmission line segment 30 by wires 50.

A capacitor 52 is mounted on the metal strip 38 adjacent the transistor 40. The capacitor comprises a flat disk 54 of a dielectric material, such as alumina and metal film plates 56 and 58 coated on opposite sides of the disk 54. The plate 56 is seated on and soldered to the metal strip 38. An impedance element 60 is connected between the capacitor plate 58 and the base electrode 42 of the transistor 40. As shown, the impedance element 60 is a relatively heavy wire.

The stripline circuit 12 comprises a metal plate 62 having a recess 64 in the top surface thereof. The recess 64 is slightly longer than the length of the substrate 14 of the transistor carrier 10. An input circuit portion 66 is mounted on the top surface of the plate 62 at one end of the recess 64 and an output circuit portion 68 is mounted on the top surface of the plate 62 at the other end of the recess 64. The input circuit portion 66 comprises a flat plate 70 of an electrical insulating material, such as a ceramic, coated on its opposed flat surfaces with metal layers 72 and 74. The metal layer 72 is bonded, such as by brazing, to the metal plate 62. The output circuit portion 68 also comprises a flat plate 76 of an electrical insulating material, such as a ceramic, coated on its opposed flat surfaces with metal layers 78 and 80. The metal layer 78 is bonded to the metal plate 62.

The transistor carrier 10 is mounted in the recess 64 in the stripline circuit plate 62 with the first transmission line segment 22 being adjacent to but slightly spaced from the output circuit portion 68 and the second transmission line segment 30 being adjacent to but slightly spaced from the input circuit portion 66. The insulating plates 70 and 76 of the input and output circuit portions 66 and 68 respectively are each of a thickness such that the metal layer 74 on the input circuit portion 66 is substantially co-planar with the metal layer 36 on the second transmission line segment 30 and the metal layer 80 on the output circuit portion 68 is substantially co-planar with the metal layer 28 on the first transmission line segment 22. A metal connecting strip 82 extends across the gap between the input circuit portion 66 and the second transmission line segment 30 and is bonded at its ends to the metal layers 74 and 36. The projecting end of the metal strip 38 extends across the gap between the first transmission line segment 22 and the output circuit portion 68 and is bonded to the metal layer 80 on the output circuit portion.

In the stripline circuit 12, the plate 62 serves as the ground plane, the metal layer 74 of the input circuit portion 66 as the input line and the metal layer 80 of the output circuit portion 68 as the output line. Since the substrate 14 of the transistor carrier 10 is mounted directly on the plate 62 and the base electrode 42 of the transistor 40 is connected to the substrate 14 by the wires 48, the base of the transistor is connected to ground. The input line 74 of the stripline circuit is connected to the emitter of the transistor 40 through the connecting strip 82, metal layer 36 of the second transmission line segment 30 and wires 50. The collector of the transistor 40 is connected to the output line 80 of the stripline circuit through the metal strip 38. The capacitor 52 and inductance element 60 are connected in series between the base electrode 42 of the transistor 40 and the output line of the stripline circuit.

Figure 3:
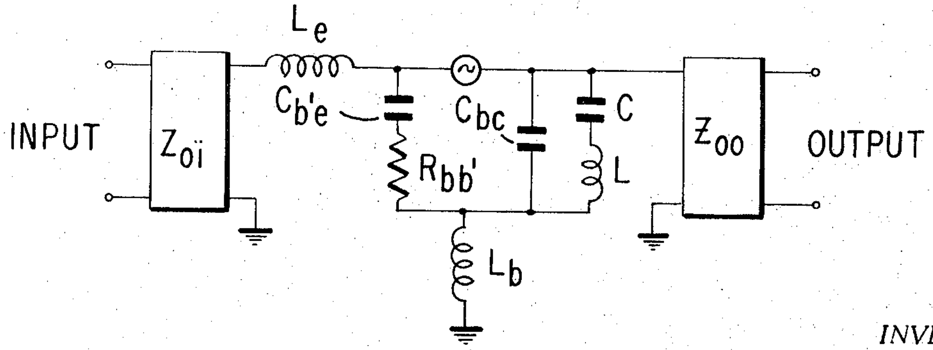
FIG. 3 is a schematic diagram of the equivalent circuit of the transistor carrier of the present invention.

Referring to FIG. 3 there is shown the equivalent circuit of the transistor carrier 10. The blocks Zoi and Zoo represent the second and first transmission line segment 30 and 22 respectively. The inductance $L_e$ is the inductance of the emitter wires 50 and inductance $L_b$ is the inductance of the base wires 48. $C_{b'e}$ represents an internal base to emitter capacitance and $R_{bb}'$ represents an internal resistance at the base electrode. The capacitance $C_{bc}$ represents the base to collector capacitance of the transistor 40. The capacitance C is the capacitance of the capacitor 52 and the inductance L is the inductance of the inductor element 60. The inductance L can be adjusted by the size of the wire 60 so that the series connected capacitor 52 and inductance element 60 provides with the base to collector capacitance $C_{bc}$ of the transistor 40 a parallel resonance circuit. This parallel resonance circuit serves to compensate the collector to base capacitance of the transistor 40 to obtain maximum power output of the transistor. Also, this parallel resonance circuit greatly reduces the reactive feedback currents through the inductance $L_b$ provided by the base wires 48. In addition, by having the capacitor 52 and inductance element 60 circuit in the carrier 10 close to the transistor 40, the effective output Q of the transistor carrier combination is decreased so as to provide better wideband compensation in the output circuit. Thus, the transistor carrier 10 of the present invention having the compensating circuit directly on the carrier adjacent the transistor not only provides the desired compensation to achieve maximum power output, but does so without substantially reducing the bandwidth capability of the circuit and in a manner so as to reduce the reactive feedback currents through the grounded base wires so as to maintain stability. The transistor carrier 10 also has the advantages of small size, relatively small parasitic reactances and good heat conducting properties which are properties which make the transistor carrier particularly suitable for use in microwave electronic circuits.

Although the transistor carrier 10 is shown and has been described with the base electrode 42 being connected to the substrate 14 and the emitter electrode 44 being connected to the metal layer 36 of the second transmission line segment 30, these connections can be reversed so that the emitter is connected to the substrate and the base is connected to the metal layer. If the emitter electrode 44 is connected to the substrate 14 so as to be connected to the ground plane of the transmission line, the inductance element 60 is connected to the emitter electrode 44 so that the series connected capacitor 52 and inductance element 60 is in parallel with the internal emitter to collector capacitance of the transistor 40 to compensate for such internal capacitance.

We claim:

1. A transistor carrier adapted to be mounted in a microwave stripline circuit comprising:

a metal substrate, input and output transmission line segments mounted in spaced relation on said substrate, each of said segments including a metal layer and a dielectric member spacing the metal layer from the substrate, a transistor mounted on said output segment, said transistor including three electrodes, a first electrode being electrically connected to the metal layer on said output segment, a second electrode being electrically connected to said substrate and a third electrode being electrically connected to the metal layer on the input segment, and an inductance-capacitance compensating network mounted on said substrate adjacent said transistor, said compensating network being electrically connected to an electrode of the transistor and the output transmission line segment and forming a parallel resonance circuit which includes the base to collector internal capacitance of the transistor to compensate for such internal capacitance.

2. A transistor carrier in accordance with claim 1 in which the compensating network comprises a capacitor electrically in series with an inductance element.

3. A transistor carrier in accordance with claim 2 in which the inductance element is electrically connected between the second electrode of the transistor and one side of the capacitor and the other side of the capacitor is electrically connected to the metal layer of the output segment.

4. A transistor carrier in accordance with claim 3 in which the capacitor is a disk of a dielectric material having metal film plates on opposed surfaces of the disk, one of the plates is mounted on the metal layer of the output segment and the inductance element is connected to the other plate.

5. A transistor carrier in accordance with claim 4 in which the inductance element is a wire connected between the other plate of the capacitor and the second electrode of the transistor.

6. A transistor carrier in accordance with claim 5 in which the transmission line segments are mounted at opposite ends of the substrate and have edges which are adjacent each other but in spaced relation and the transistor is mounted on the metal layer of the output segment adjacent the adjacent edge of the output segment.

7. A transistor carrier in accordance with claim 6 in which the second electrode of the transistor is connected to the substrate by at least one wire extending between the second electrode and the surface of the substrate between the segments and the third electrode is connected to the metal layer on the output segment by at least one wire extending between the third electrode and the metal layer at the adjacent edge of the output segment.

8. A transistor carrier in accordance with claim 7 including a metal strip extending over and bonded to the metal layer on the output segment, said metal strip extending beyond the end of the substrate, and the transistor and capacitor as mounted on the metal strip.

* * * * *

UNITED STATES PATENT OFFICE
CERTIFICATE OF CORRECTION

Patent No. 3,825,805 Dated July 23, 1974

Inventor(s) Erwin Franz Belohoubek et al.

It is certified that error appears in the above-identified patent and that said Letters Patent are hereby corrected as shown below:

In claim 6, column 6, line 6, "output" should read --input--; in claim 7, column 6, lines 13 and 16, "output" should read --input--.

Signed and sealed this 22nd day of October 1974.

(SEAL)
Attest:

McCOY M. GIBSON JR.
Attesting Officer

C. MARSHALL DANN
Commissioner of Patents